(12) United States Patent  (10) Patent No.: US 8,697,333 B2
Soga et al.  (45) Date of Patent: *Apr. 15, 2014

(54) PHOTOCURABLE RESIN COMPOSITION, DRY FILM THEREOF, PATTERN FORMING METHOD, AND ELECTRICAL/ELECTRONIC PART PROTECTIVE FILM

(75) Inventors: Kyoko Soga, Annaka (JP); Takanobu Takeda, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 168 days.

This patent is subject to a terminal disclaimer.

(21) Appl. No.: 13/271,858

(22) Filed: Oct. 12, 2011

(65) Prior Publication Data

US 2012/0094222 A1 Apr. 19, 2012

(30) Foreign Application Priority Data

Oct. 13, 2010 (JP) ................................ 2010-230427

(51) Int. Cl.
G03C 1/00 (2006.01)
G03F 7/00 (2006.01)

(52) U.S. Cl.
USPC ..................................... 430/270.1; 430/280.1

(58) Field of Classification Search
USPC ...................... 430/17, 270.1, 280.1, 320, 325
See application file for complete search history.

(56) References Cited

U.S. PATENT DOCUMENTS

| | | | |
|---|---|---|---|
| 3,159,601 A | 12/1964 | Ashby | |
| 3,159,662 A | 12/1964 | Ashby | |
| 3,220,972 A | 11/1965 | Lamoreaux | |
| 3,775,452 A | 11/1973 | Karstedt | |
| 7,700,403 B2 | 4/2010 | Arai et al. | |
| 7,785,766 B2 | 8/2010 | Kato et al. | |
| 2005/0260522 A1 | 11/2005 | Weber et al. | |
| 2008/0182087 A1* | 7/2008 | Kato et al. | 428/195.1 |
| 2011/0076465 A1* | 3/2011 | Takeda et al. | 428/195.1 |
| 2011/0143092 A1* | 6/2011 | Asai et al. | 428/141 |

FOREIGN PATENT DOCUMENTS

| | | | |
|---|---|---|---|
| EP | 1953183 A2 | 8/2008 | |
| JP | 2007-522531 A | 8/2007 | |
| JP | 2008-184571 A | 8/2008 | |
| JP | 2009-200315 A | 9/2009 | |
| WO | WO 2007/118794 A1 | 10/2007 | |
| WO | WO 2010/046240 A1 | 4/2010 | |

OTHER PUBLICATIONS

Extended European Search Report for European Application No. 11184812.3, dated Mar. 8, 2012.

* cited by examiner

Primary Examiner — Stewart Fraser
(74) Attorney, Agent, or Firm — Birch, Stewart, Kolasch & Birch, LLP

(57) ABSTRACT

A photocurable composition includes:

(A) an epoxy group-containing polymer compound having repeating units represented by the following formula (1),

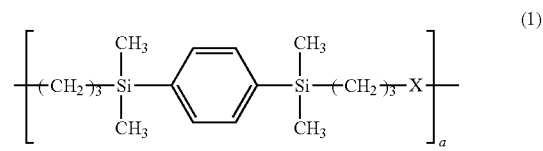

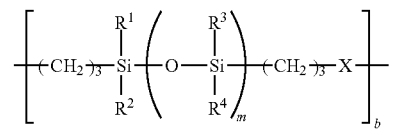

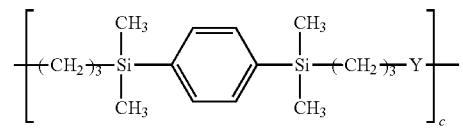

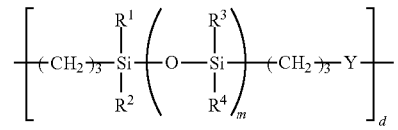

where $R^1$ to $R^4$ are each a hydrocarbon group, m is an integer of 1 to 100, a, b, c and d are each 0 or a positive number, such that $0<(c+d)/(a+b+c+d)\leq 1.0$, and X and Y are each the formula (2) or (3), provided that at least one group of the formula (3) is present,

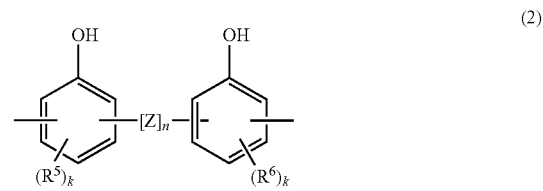

-continued
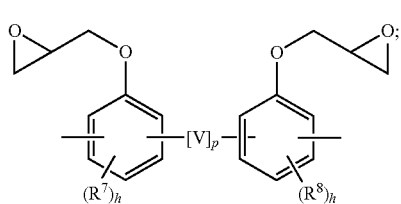
(3)
(B) a photoacid generator represented by the formula (8)
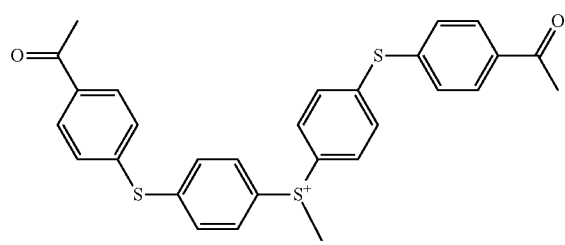
(8)
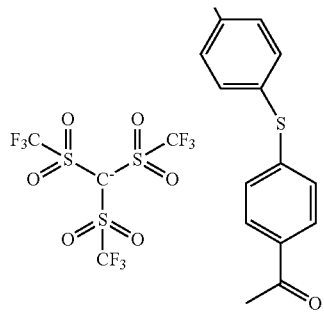
and
(C) a solvent.
15 Claims, No Drawings

PHOTOCURABLE RESIN COMPOSITION, DRY FILM THEREOF, PATTERN FORMING METHOD, AND ELECTRICAL/ELECTRONIC PART PROTECTIVE FILM

CROSS-REFERENCE TO RELATED APPLICATION

This non-provisional application claims priority under 35 U.S.C. §119(a) on Patent Application No. 2010-230427 filed in Japan on Oct. 13, 2010, the entire contents of which are hereby incorporated by reference.

TECHNICAL FIELD

The present invention relates to a novel photocurable resin composition containing an epoxy group-containing polymer compound and a photoacid generator, a dry film thereof, a pattern forming method using the composition or the dry film, and, further, a laminate obtained by using the composition or the dry film, and a film for protection of electrical/-electronic parts such as substrate, circuit, wiring, etc.

BACKGROUND ART

As various electronic apparatuses such as personal computers, digital cameras, cell phones, etc. have been tending to be smaller in size and higher in performance, there has been a rapidly increasing demand for semiconductor devices smaller in size, smaller in thickness and higher in density. In this connection, there is a keen expectation for development of a photosensitive insulating material which can cope with an increase in substrate area for attaining an enhanced productivity, can also cope with a structure having fine ruggedness with high aspect ratios on a substrate, in high-density mounting technology such as chip size packaging, chip scale packaging (CSP) or three-dimensional stacking, and is effective for use as an adhesive between stacked substrates.

As a photosensitive insulating material as above-mentioned, a photocurable resin composition has been proposed which can be applied in a wide range of film thickness by a spin coating method (commonly used in semiconductor device manufacturing process), can enable fine pattern formation using radiations in a wide wavelength range, and can give electrical/electronic part protective film excellent in flexibility, heat resistance, electrical characteristics, adhesion, reliability and chemical resistance through low-temperature post-curing (Patent Document 1: JP-A 2008-184571). However, when the photocurable resin composition is applied by spin coating to a substrate having a rugged substrate, it is difficult to coat the substrate substantially evenly. In such a case, therefore, gaps (voids) in the photocurable resin layer are liable to be generated at step portions on the substrate. Thus, further improvements in planarization and step coverage have been requested.

In addition, as the other applying method for substituting the above-mentioned spin coating method, a spraying method has been proposed (Patent Document 2: JP-A 2009-200315). In principle, however, this method is liable to result in generation of such defects as differences in height arising from ruggedness of the substrate, film interruption (film breakage) at pattern edges, and pinholes in bottom surfaces of recessed portions. In addition, where the substrate has large variations in height, the composition should have a high viscosity for obtaining a required film thickness, and there remain planarization and step coverage problems yet to be solved sufficiently.

Besides, there has been proposed a photocurable resin composition which includes a multifunctional epoxy resin and a phenolic curing agent and which enables pattern formation in high aspect ratios (Patent Document 3: JP-A 2007-522531). Dry films of 1 to 100 μm in thickness formed by using the composition and applications of these materials are also proposed in the Patent Document 3. However, the internal stress in the resin is high, and an improvement is needed as to flexibility in lamination (bonding) of substrates. In addition, since the resin is poor in transparency, light absorption would occur in the film coat, the sensitivity at the time of pattern formation of a thick film would be lowered, and an exposure energy difference would be generated between a resist surface layer and a bottom surface portion due to absorption by the film coat itself. This would lead to deterioration of shape (rectangularity), or to non-uniform sensitivity in the plane of the substrate having a considerably rugged surface. Furthermore, in relation to use for lamination (bonding) of substrates, there is a demand for formation of a film coat which is good in substrate adhesion properties and which is free from generation of degassing which, if generated, would cause lamination (bond) faults.

SUMMARY OF THE INVENTION

The present invention has been made in consideration of the above-mentioned circumstances. Accordingly, it is an object of the present invention to provide: a photocurable resin composition which enables fine pattern formation in thick film to be carried out easily and with excellent verticalness of pattern shape, enables easy pattern formation with high sensitivity even on a substrate having a rugged surface, is excellent in various film characteristics (particularly, adhesion to a circuit substrate) even in the case of low-temperature post-curing, is excellent in reliability as electrical/electronic parts, and has high reliability as a substrate-bonding material; a dry film of the composition; a laminate formed by using the composition or the dry film; a pattern forming method using the composition or the dry film; and an electrical/electronic part protective film formed by using the composition or the dry film.

The present inventors made intensive and extensive investigations in order to attain the above object, and, as a result of the investigations, found out that a photocurable resin composition including an epoxy group-containing polymer compound having repeating units represented by the general formula (1) set forth below and a weight average molecular weight of 3,000 to 500,000, together with a photoacid generator represented by the general formula (8) set forth below and capable of generating an acid through decomposition, particularly, under radiations with a wavelength of 190 to 500 nm, is excellent as a film for protection of electrical/electronic parts. It was also found out that this photocurable resin composition can be formed into a film with a wide range of thickness, and enables a fine pattern with excellent verticalness to be formed by the pattern forming method described later. Further, it was found out that a cured film obtained by the pattern forming method using the photocurable resin composition or the dry film thereof are excellent in pattern properties, heat resistance, electrical insulating properties, reliability as an insulating protective film, and, particularly, in adhesion to substrate. These findings have led to the present invention.

Accordingly, the present invention provides a photocurable resin composition, a dry film thereof, as well as a laminate or stacked body, a pattern forming method and an electrical/electronic part protective film, which will be set forth in the following paragraphs [1] to [14].

[1] A photocurable resin composition including:

(A) 100 parts by weight of an epoxy group-containing polymer compound having repeating units represented by the following general formula (1) and having a weight average molecular weight of 3,000 to 500,000,

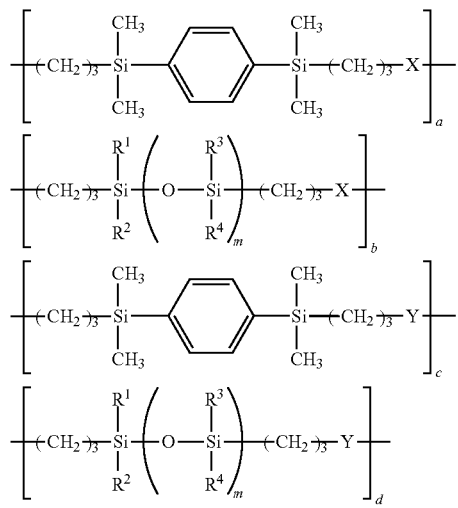

where $R^1$ to $R^4$, which may be identical or different, are each a monovalent hydrocarbon group of 1 to 8 carbon atoms, m is an integer of 1 to 100, a, b, c and d each indicate the proportion of each of the repeating units based on the total number of the repeating units, and are each 0 or a positive number, such that c and d are not simultaneously 0 and that $0<(c+d)/(a+b+c+d)\leq 1.0$, and X and Y are each a divalent organic group represented by the following general formula (2) or (3), provided that the polymer compound has at least one divalent organic group represented by the formula (3),

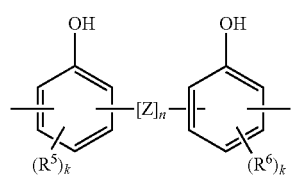

where Z is a divalent organic group selected from among

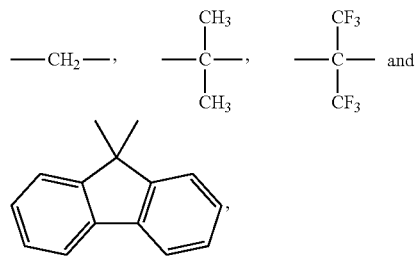

n is 0 or 1, $R^5$ and $R^6$, which may be identical or different, are each an alkyl or alkoxy group of 1 to 4 carbon atoms, and k is any of 0, 1 and 2,

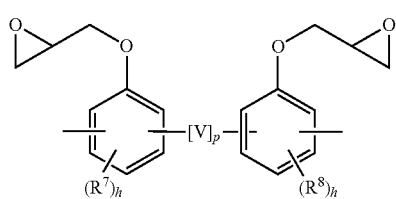

where V is a divalent organic group selected from among

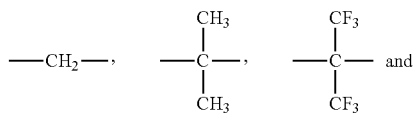

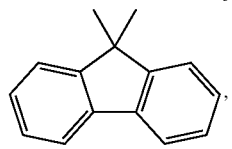

p is 0 or 1, $R^7$ and $R^8$, which may be identical or different, are each an alkyl or alkoxy group of 1 to 4 carbon atoms, and h is any of 0, 1 and 2;

(B) 0.05 to 20 parts by weight of a photoacid generator represented by the following formula (8),

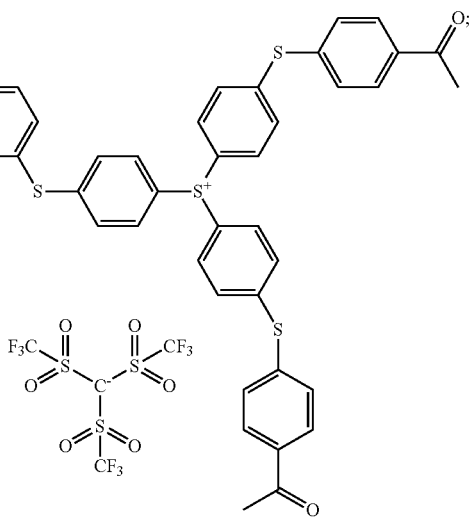

and (C) a solvent.

[2] The photocurable resin composition according to the above paragraph [1], wherein in the general formula (1) of component (A), X is a divalent organic group represented by the general formula (2), and Y is a divalent organic group represented by the general formula (3).

[3] The photocurable resin composition according to the above paragraph [1] or [2], wherein in the general formula (1), $0.05\leq c/(a+b+c+d)\leq 0.5$.

[4] The photocurable resin composition according to the above paragraph [1] or [2], wherein in the general formula (1), $0.05\leq d/(a+b+c+d)\leq 0.5$.

[5] The photocurable resin composition according to any one of the above paragraphs [1] to [4], further including (D) a crosslinking agent.
[6] The photocurable resin composition according to the above paragraph [5], wherein the crosslinking agent of component (D) is at least one epoxy compound having two or more epoxy groups on average in one molecule thereof.
[7] The photocurable resin composition according to any one of the above paragraphs [1] to [6], further including (E) a basic compound.
[8] A photocurable dry film obtained by applying the photocurable resin composition according to any one of the above paragraphs [1] to [7] to a support film, followed by drying.
[9] A laminate wherein cured product layers of the photocurable resin composition according to any one of the above paragraphs [1] to [7] or the photocurable dry film according to the above paragraph [8] are laminated on a substrate provided with a groove and/or a hole having an aperture width of 10 to 100 μm and a depth of 10 to 120 μm.
[10] A pattern forming method including the steps of:
(i) applying the photocurable resin composition according to any one of the above paragraphs [1] to [7] to a substrate and then optionally heating the photocurable resin composition, or bringing the photocurable dry film according to the above paragraph [8] into close contact with a substrate and then optionally heating the photocurable dry film, so as to form a photocurable resin layer on the substrate;
(ii) exposing the photocurable resin layer to light through a photomask; and
(iii) heat treating the resin layer after exposure and then developing it with a developing liquid so as to dissolve away a non-exposed portion of the photocurable resin layer.
[11] The pattering forming method according to the above paragraph [10], further including the step of (iv) post-curing the resin layer having a pattern formed by the development at a temperature of 100 to 250° C.
[12] The pattern forming method according to the above paragraph [10] or [11], wherein the substrate is provided with a groove and/or a hole having an aperture width of 10 to 100 μm and a depth of 10 to 120 μm.
[13] A film for protecting an electrical/electronic part comprising a cured film obtained by the pattern forming method according to the above paragraph [10] or [11].
[14] A film for bonding a substrate comprising a cured film obtained by the pattern forming method according to the above paragraph [10] or [11].

ADVANTAGEOUS EFFECTS OF THE INVENTION

The use of the photocurable resin composition containing the epoxy group-containing polymer compound and the photoacid generator according to the present invention or the use of the photocurable dry film according to the present invention ensures that on a substrate having a planar surface and on a substrate having a rugged surface, epoxy groups of the epoxy group-containing polymer compound can be crosslinked with one another and fine pattern formation can be achieved over a wide range of film thickness and with rays in a wide wavelength range. In addition, particularly where the photocurable resin composition contains a small amount of an epoxy compound as a crosslinking agent, the crosslinking is further accelerated favorably.
The photocurable resin composition in the present invention is free from generation of side reaction gases in a photo-crosslinking reaction or a heat-crosslinking reaction; therefore, when used for substrate lamination, the composition would not induce lamination faults. Besides, the photocurable resin composition in the present invention has high transparency in an exposure wavelength region. Even where the photocurable resin layer on a substrate is thick, therefore, light absorption by the resin layer itself is little, so that high-sensitivity pattern formation can be achieved.
When subjected to a heating treatment at a low temperature of 250° C. or below after pattern formation by rays, the photocurable resin composition or the photocurable dry film in the present invention is excellent in adhesion to a substrate used for electronic parts, semiconductor devices or circuit substrates and in mechanical characteristics and electrical insulating properties. In addition, the resin composition or the dry film is high in reliability as an insulating protective film, and can prevent cracking of the protective film. Therefore, the photocurable resin composition or the photocurable dry film can be suitably used for forming a film for protection of various electrical/electronic parts such as circuit substrates, semiconductor devices, and display elements. Besides, the film is also excellent as a substrate-bonding material and can be easily formed by use of the photocurable resin composition or the photocurable dry film. Particularly, the film can be used as an insulating film for semiconductor devices (inclusive of the use for re-wiring), as an insulating film for multilayer printed wiring board, as an insulating film for through-silicon via (TSV), and as a cover film, in view of its heat resistance, insulating properties and flexibility. In addition, since the film has adhesiveness, it can be used for substrate lamination.

DESCRIPTION OF THE EMBODIMENTS

The photocurable resin composition in the present invention contains: (A) an epoxy group-containing polymer compound having repeating units represented by the following general formula (1) and a weight average molecular weight of 3,000 to 500,000; (B) a photoacid generator represented by the following general formula (8); and (C) a solvent.

Photocurable Resin Composition

[(A) Epoxy Group-Containing Polymer Compound]

The component (A) is an epoxy group-containing polymer compound which has repeating units represented by the following general formula (1) and a weight average molecular weight of 3,000 to 500,000.

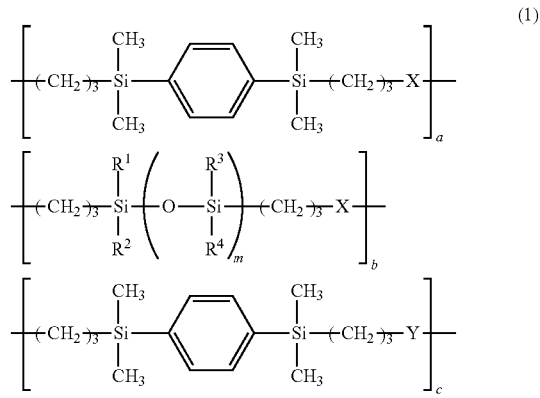

-continued

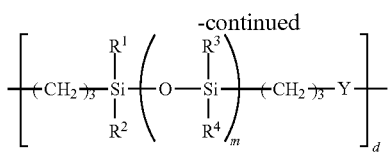

In the above formula, $R^1$ to $R^4$, which may be identical or different, are each a monovalent hydrocarbon group of 1 to 8 carbon atoms, preferably 1 to 6 carbon atoms. Specific examples of the monovalent hydrocarbon group include straight chain, branched or cyclic alkyl groups such as methyl, ethyl, propyl, isopropyl, n-butyl, tert-butyl, cyclohexyle, etc.; straight chain, branched or cyclic alkenyl groups such as vinyl, allyl, propenyl, butenyl, hexenyl, cyclohexenyl, etc.; aryl groups such as phenyl, tolyl, etc.; and aralkyl groups such as benzyl, phenylethyl, etc.

In addition, taking into account photocurability as well as compatibility with the photoacid generator and a crosslinking agent which will be described later, m in the above formula (1) is an integer of 1 to 100, preferably 1 to 80. Besides, a, b, c and d in the formula each indicate the proportion of each of the repeating units based on the total number of the repeating units. Taking adhesion to the substrate, electrical characteristics and reliability into account, a, b, c and d are each 0 or a positive number, such that c and d are not simultaneously 0, and that $0<(c+d)/(a+b+c+d)\leq 1.0$, preferably $0.1\leq(c+d)/(a+b+c+d)\leq 0.5$, and more preferably $0.15\leq(c+d)/(a+b+c+d)\leq 0.25$.

In this case, it is preferable, from the viewpoint of securing good strength of the cured film coat after post-cure, that $0.05\leq c/(a+b+c+d)\leq 0.5$, more preferably $0.05\leq c/(a+b+c+d)\leq 0.3$, particularly $0.05\leq c/(a+b+c+d)\leq 0.15$, and that $0.05\leq d/(a+b+c+d)\leq 0.5$, more preferably $0.05\leq d/(a+b+c+d)\leq 0.3$, particularly $0.1\leq d/(a+b+c+d)\leq 0.2$. Incidentally, $a+b+c+d=1$, and a+b is the remainder left after c+d is subtracted from 1, provided that either of a and b may be 0.

Furthermore, X and Y are each a divalent organic group represented by the following general formula (2) or (3), provided that the polymer compound in the present invention has at least one divalent group represented by the formula (3), and, preferably, X is the formula (2) and Y is the formula (3).

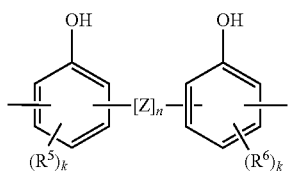

where Z is a divalent organic group selected from among

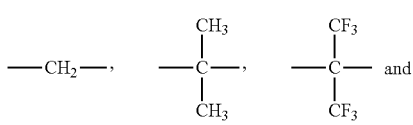

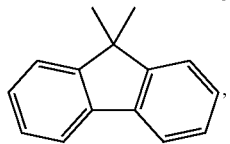

n is 0 or 1, $R^5$ and $R^6$, which may be identical or different, are each an alkyl or alkoxy group of 1 to 4 carbon atoms, and values of k are each independently any of 0, 1 and 2.

Specific examples of $R^5$ and $R^6$ include methyl, ethyl, isopropyl, tert-butyl, methoxy, ethoxy, and isopropyloxy groups.

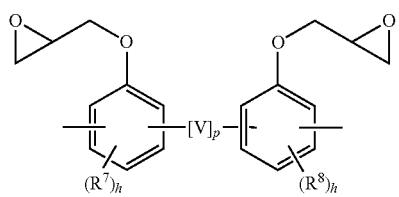

where V is a divalent organic group selected from among

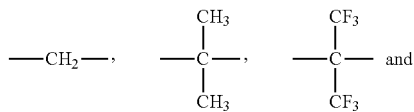

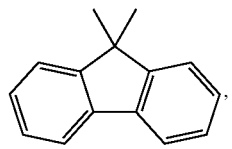

p is 0 or 1, $R^7$ and $R^8$, which may be identical or different, are each an alkyl or alkoxy group of 1 to 4 carbon atoms, and values of h are each any of 0, 1 and 2.

Specific examples of $R^7$ and $R^8$ include the same groups as mentioned above as specific examples of $R^5$ and $R^6$.

The epoxy group-containing polymer compound as above has a weight average molecular weight of 3,000 to 500,000, preferably 5,000 to 300,000. The weight average molecular weight in the range of 3,000 to 500,000 is preferable from the viewpoint of compatibility and photocurability of the photocurable resin composition in which the epoxy group-containing polymer compound is used, and from the viewpoint of mechanical properties of a cured film coat including the photocurable resin composition. Incidentally, in the present invention, the weight average molecular weight is a value on a polystyrene basis which is determined through gel permeation chromatography (GPC).

The epoxy group-containing polymer compound in the present invention can be prepared by bringing a hydrogensilphenylene (1,4-bis(dimethylsilyl)benzene) of the following formula (4),

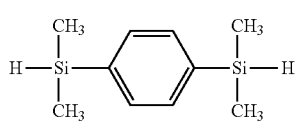

and/or a dihydroorganosiloxane represented by the following general formula (5)

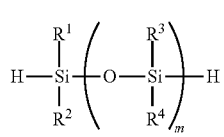

(5)

(in the formula, $R^1$, $R^2$, $R^3$, $R^4$ and m are the same as above-mentioned)
and a specific epoxy group-containing compound having a diallyl group represented by the following general formula (6)

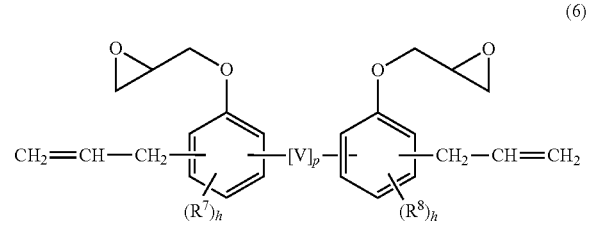

(6)

(in the formula, V, $R^7$, $R^8$, p and h are the same as above-mentioned)
and, further, a specific phenol compound having a diallyl group represented by the following general formula (7)

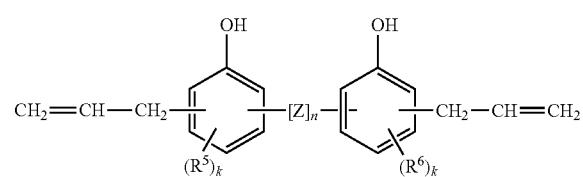

(7)

(in the formula, Z, $R^5$, $R^6$, n and k are the same as above-mentioned)
into a so-called "hydrosilylation" polymerization reaction in the presence of a hydrosilylation catalyst.

Incidentally, the weight average molecular weight of the epoxy group-containing polymer compound having the repeating units represented by the formula (1) in the present invention can be easily controlled by regulating the ratio of the total number of the allyl groups of the phenol compounds represented by the above formulas (6) and (7) to the total number of the hydrosilyl groups of the hydrogensilpheylene represented by the above formula (4) and/or the dihydroorganosiloxane represented by the above formula (5) [namely, (the total number of the allyl groups)/(the total number of the hydrosilyl groups)]. Or, alternatively, at the time of polymerization of the above-mentioned diallyl phenol compounds with the hydrogensilphenylene or the dihydroorganosiloxane, for example, a monoallyl compound such as o-allylphenol or a monohydrosilane such as triethylhydrosilane or a monohydrosiloxane may be used as a molecular weight modifier, whereby the above-mentioned weight average molecular weight can be easily controlled.

Examples of the hydrosilylation catalyst which can be used for the above-mentioned polymerization reaction include: platinum group metals used alone, such as platinum (inclusive of platinum black), rhodium, palladium, etc.; platinum compounds, rhodium compounds and palladium compounds, typically platinum chloride, chloroplatinic acid, and chloroplatinic acid salts, such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, $Na_2HPtCl_4 \cdot xH_2O$ (in the formulas, x is preferably an integer of 0 to 6, particularly 0 or 6); alcohol-modified chloroplatinic acid (U.S. Pat. No. 3,220,972); chloroplatinic acid-olefin complexes (U.S. Pat. Nos. 3,159,601; 3,159,662; 3,775,452); catalysts obtained by supporting a platinum group metal such as platinum black, palladium, etc. on a support formed of alumina, silica, carbon or the like; rhodium-olefin complexes; chlorotris(triphenylphosphine)rhodium (so-called Wilkinson's catalyst); complexes of platinum chloride, chloroplatinic acid or a chloroplatinic acid salt with a vinyl group-containing siloxane (particularly, a vinyl group-containing cyclic siloxane), etc.

Such a catalyst is used in a catalytic amount. Normally, the amount of the catalyst is preferably 0.001 to 0.1 wt %, as platinum group metal, based on the total amount of the reactants put to the polymerization reaction.

In the above-mentioned polymerization reaction, a solvent may be used, as required. Preferable examples of the solvent which can be used here are hydrocarbon solvents such as toluene and xylene.

From the viewpoint of ensuring that the catalyst is not deactivated and that the polymerization can be completed in a short time, the polymerization temperature is preferably, for example, 40 to 150° C., particularly 60 to 120° C.

The polymerization time, which depends on the kind and amount of the polymerizate, is preferably about 0.5 to 100 hours, particularly 0.5 to 30 hours until the polymerization is finished, for the purpose of preventing intervening of moisture in the polymerization system. After the polymerization reaction is thus finished, the solvent, if used, is distilled off, whereby the epoxy group-containing polymer compound represented by the formula (1) in the present invention can be obtained.

Incidentally, when the weight average molecular weight of the epoxy group-containing polymer compound is lowered, the viscosity of the epoxy group-containing polymer compound is lowered accordingly. Therefore, the coefficient of viscosity of the photocurable resin layer formed by use of the epoxy group-containing polymer compound is also lowered. Besides, in the molecule of the epoxy group-containing polymer compound, when the proportion of the molecular units containing the straight chain polysiloxane [b and d in the general formula (1)] is increased, the proportion of the molecular units containing the aromatic compound such as silphenylene [a and c in the general formula (1)] is decreased, whereby the viscosity of the epoxy group-containing polymer compound is lowered. This results in that the coefficient of viscosity of the photocurable resin layer formed by use of the epoxy group-containing polymer compound is also lowered. Furthermore, in the molecule of the epoxy group-containing polymer compound, when the molecular chain length of the straight chain polysiloxanes increases, namely, when the value of m in the general formula (1) increases, the viscosity of the epoxy group-containing polymer compound is lowered. As a result, the coefficient of viscosity of the photocurable resin layer formed by use of the epoxy group-containing polymer compound is also lowered.

[(B) Photoacid Generator]

The photocurable resin composition according to the present invention contains (B) a photoacid generator. The photoacid generator is a compound represented by the following formula (8), which generates an acid through decomposition, particularly, under rays having a wavelength of 190 to 500 nm, thereby functioning as a curing catalyst.

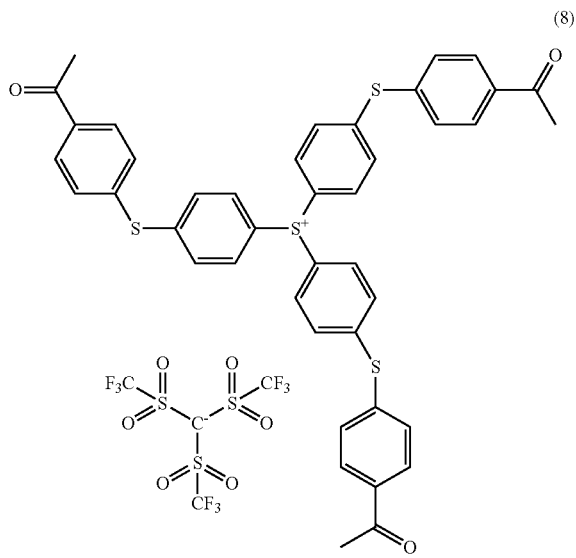 [SMILES: CC(=O)c1ccc(Sc2ccc([S+](c3ccc(Sc4ccc(C(C)=O)cc4)cc3)c3ccc(Sc4ccc(C(C)=O)cc4)cc3)cc2)cc1 ; O=S(=O)([C-](S(=O)(=O)C(F)(F)F)S(=O)(=O)C(F)(F)F)C(F)(F)F]

(8)

From the viewpoint of photocurability of the photocurable resin composition, the photoacid generator is preferably blended in the composition in an amount of 0.05 to 20 parts by weight, particularly 0.05 to 5 parts by weight, based on 100 parts by weight of the epoxy group-containing polymer compound. If the amount of the photoacid generator of the formula (8) is less than 0.05 parts by weight, the amount of the acid generated would be insufficient for satisfactory progress of the crosslinking reaction. If the amount exceeds 20 parts by weight, on the other hand, the light absorbance of the photoacid generator itself increases, leading to such a problem as lowering of transparency.

[(C) Solvent]

The photocurable resin composition in the present invention contains (C) a solvent. As the solvent to be blended in the composition, there is selected a solvent which can solve the epoxy group-containing polymer compound and the photoacid generator mentioned above, as well as the crosslinking agent and the basic compound to be described later, and other various additives. Organic solvents are excellent in ability to dissolve these components of the composition.

Examples of the organic solvents include: ketones such as cyclohexanone, cyclopentanone, methyl-2-n-amyl ketone, etc.; alcohols such as 3-methoxybutanol, 3-methyl-3-methoxybutanol, 1-methoxy-2-propanol, 1-ethoxy-2-propanol, etc.; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, etc.; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, etc., which may be used either singly or in combination of two or more of them. Among the just-mentioned solvents, particularly preferred are ethyl lactate, cyclohexane, cyclopentanone, propylene glycol monomethyl ether acetate, γ-butyrolacone and their mixed solvents, because they are the highest in ability to dissolve the photoacid generator.

From the viewpoint of compatibility and viscosity of the photocurable resin composition, the amount of the solvent(s) to be used is preferably 50 to 2,000 parts by weight, more preferably 50 to 1,000 parts by weight, particularly 50 to 100 parts by weight, based on 100 parts by weight in total of the epoxy group-containing polymer compound and the photoacid generator.

[(D) Crosslinking Agent]

Furthermore, the photocurable resin composition according to the present invention, preferably, contains (D) a crosslinking agent. The crosslinking agent as component (D) is not specifically restricted, and can contain an epoxy compound having an average of two or more epoxy groups in one molecule thereof. The crosslinking agent is a component for enabling easy pattern formation by undergoing a condensation reaction with the phenol groups or the alkoxy groups of $R^5$ and/or $R^6$ in the formula (2) of component (A), and is effective as a component for further enhancing the strength of the cured product obtained. From the viewpoint of photocurability and heat resistance, the weight average molecular weight of the crosslinking agent is preferably 150 to 10,000, particularly 200 to 3,000.

Preferable examples of the crosslinking agent to be used here include: bisphenol-type epoxy resins such as bisphenyl A type epoxy resin, bisphenol F type epoxy resin, etc.; novolak-type epoxy resins such as phenol novolak type epoxy resin, cresol novolak type epoxy resin, etc.; triphenolalkane type epoxy resins and their polymerizates; biphenyl-type epoxy resins; dicyclopentadiene-modified phenol novolak type epoxy resins; phenolaralkyl-type epoxy resins; biphenylaralkyl-type epoxy resins; naphthalene ring-containing epoxy resins; glycidyl ester type epoxy resins; alicyclic epoxy resins; and heterocyclic epoxy resins. Among the crosslinking agents, preferred are bisphenol-type epoxy resins and novolak-type epoxy resins. The crosslinking agents may be used either singly or in combination of two or more of them. From the viewpoint of flexibility, chemical resistance and adhesion to the substrate, the amount of the crosslinking agent(s) to be used is preferably 0 to 50 parts by weight, more preferably 0 to 30 parts by weight, and particularly 0.1 to 30 parts by weight, based on 100 parts by weight of the epoxy group-containing polymer compound of component (A).

[(E) Basic Compound]

Furthermore, the photocurable resin composition in the present invention may contain (E) a basic compound. For use as the basic compound, preferred is a compound capable of suppressing the diffusion rate in the process in which the acid generated from the photoacid generator diffuses within the photocurable resin layer. With the basic compound blended in the composition, resolution can be enhanced, variations in sensitivity after exposure can be restrained, substrate dependency or environment dependency can be lessened, and exposure allowance and pattern shape can be improved.

Examples of the basic compound which can be used here include primary, secondary and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, and imide derivatives.

Specifically, examples of the primary aliphatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

In addition, examples of the mixed amines include dimethylethylamine, methylethylpropylamine, benzylamine, phenetylamine, and benzyldimethylamine.

Specific examples of the aromatic amines and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), oxazole derivatives (e.g., oxazole, isooxazole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazane derivatives, pyrroline derivatives (e.g., pyrroline, 2-methyl-2-pyrroline, etc.), pyrrolidine derivatives (e.g., pyrrolidine, N-methylpyrrolidine, pyrrolidinone, N-methylpyrrolidone, etc.), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethyoxypyridine, 1-methyl-2-pyridine, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperadine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazol derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Further, examples of the nitrogen-containing compounds having a carboxyl group include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, etc.).

Examples of the nitrogen-containing compounds having a sulfonyl group include 3-pyridinesulfonic acid, and pyridinium p-toluenesulfonate.

Examples of the nitrogen-containing compounds having a hydroxyl group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperazineethanol, 1-(2-hydroxylethyl)pyrrolidine, 1-(2-hydroxyethyl)-2-pyrrolidinone, 3-piperizino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, and N-(2-hydroxyethyl)isonicotinamide.

Examples of the amide derivatives include formamide, N-methylformamide, N,N-dimethylformamide, acetamide, N-methylacetamide, N,N-dimethylacetamide, propionamide, and benzamide.

Examples of the imide derivatives include phthalimide, succinimide, and maleimide.

Furthermore, one or at least two compounds selected from basic compounds represented from the following general formula (9) may be added to the photocurable resin composition.

$$N(\alpha)_q(\beta)_{3-q} \qquad (9)$$

In the general formula (9), q is 1, 2 or 3. The side chains α, which may be identical or different, are each a substituent group represented by any of the following general formulas (10) to (12). The side chains β, which may be identical or different, are each a hydrogen atom or a straight chain, branched or cyclic alkyl group of 1 to 20 carbon atoms, and may contain an ether linkage or a hydroxyl group. Besides, the side chains a may be mutually linked to form a ring.

(10)

(11)

(12)

In the above formulas, $R^{200}$, $R^{302}$ and $R^{305}$ are each a straight chain or branched alkyl group of 1 to 4 carbon atoms, while $R^{202}$ and $R^{304}$ are each a hydrogen atom or a straight chain, branched or cyclic alkyl group of 1 to 20 carbon atoms, and may contain at least one groups and/or linkages selected from among hydroxyl groups, ether linkages, ester linkages and lactone rings. $R^{303}$ is a single bond or a straight chain or branched alkylene group of 1 to 4 carbon atoms, while $R^{306}$ is a straight chain, branched or cyclic alkyl group of 1 to 20 carbon atoms, and may contain at least one groups and/or linkages selected from among hydroxyl groups, ether linkages, ester linkages, and lactone rings.

Specific examples of the compound represented by the above general formula (9) include: tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-(2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-(pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis-(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxytetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone, which are not limitative.

Incidentally, the above-mentioned basic compounds may be used either singly or in combination of two or more of them. From the viewpoint of sensitivity, the amount of the basic compound(s) blended in the photocurable resin composition is preferably 0 to 3 parts by weight, more preferably 0.01 to 3 parts by weight, particularly 0.01 to 1 parts by weight, based on 100 parts by weight of the epoxy group-containing polymer compound of component (A).

[Other Additives]

To the photocurable resin composition in the present invention, additives may further be added other than the above-mentioned components. As one of the additives, for example, a surfactant commonly used for enhancing application (coating) properties of resin compositions can be added.

As the surfactant, non-ionic ones are preferably used. Examples of the non-ionic surfactants include fluoro-surfactant, specific examples of which include perfluoroalkylpolyoxyethyleneethanols, fluorinated alkyl esters, perfluoroalkylamine oxides, and fluorine-containing organosiloxane compounds.

As such surfactants, commercial ones can be used, examples of which include FLUORAD "FC-430" (made by Sumitomo 3M Limited), SURFLON "S-141" and "S-145" (both made by Asahi Glass Co., Ltd.), UNIDYNE "DS-401," "DS-4031" and "DS-451" (all made by Daikin Industries Ltd., MEGAFAC "F-8151" (made by Dainippon Ink and Chemicals, Inc., and "X-70-093" (made by Shin-Etsu Chemical Co., Ltd.). Among these, preferred are FLUORAD "FC-430" (made by Sumitomo 3M Limited) and "X-70-093" (made by Shin-Etsu Chemical Co., Ltd.).

Besides, as other additive, a light absorber may be added for enhancing light absorbance of the photoacid generator. Examples of such a light absorber include diaryl sulfoxides, diaryl sulfones, 9,10-dimethylanthracene, and 9-fluorenone.

Preparation of the Photocurable Resin Composition according to the present invention is carried out by an ordinary method. Thus, the above-mentioned components are mixed under stirring, optionally followed by filtering off solid matter by a filter or the like, whereby the photocurable resin composition can be prepared.

The photocurable resin composition thus prepared can be suitably used, for example, as material for a protective film for semiconductor devices, a protective film for wiring, a cover film, a solder mask, and an insulating film for through-silicon via (TSV), and, further, as an adhesive for bonding between stacked substrates in three-dimensional stacking.

Pattern Forming Method

Now, a pattern forming method according to the present invention in which the above-mentioned photocurable resin composition is used will be described below.

The pattern forming method according to the present invention includes the steps of:

(i) applying the photocurable resin composition to a substrate and then optionally heating the photocurable resin composition so as to form a photocurable resin layer;

(ii) exposing the photocurable resin layer to light through a photomask; and (iii) heat treating the resin layer after exposure and then developing with a developing liquid so as to dissolve away a non-exposed portion of the photocurable resin layer, the method preferably further including the step of (iv) post-curing the resin layer having a pattern formed by the development by means of heating treatment.

As a result of these steps, the desired film for protecting an electrical/electronic part can be obtained.

In the pattern formation carried out using the photocurable resin composition, (i) the photocurable resin composition is applied to a substrate to form a photocurable resin layer. Examples of the substrate used herein include a silicon wafer, a TSV silicon wafer, a silicon wafer thinned by back-side polishing, plastic or ceramic substrates, and substrates having a surface plated entirely or partly with a metal such as Ni, Au, etc. by an ion sputtering method or a plating method. A substrate provided with a groove(s) or a hole(s) having an aperture width of 10 to 100 μm and a depth of 10 to 120 μm may be used in some cases.

The application of the photocurable resin composition can be conducted adopting a known lithographic technique. For instance, the photocurable resin composition can be applied to the substrate by such a technique as dipping, spin coating, and roll coating. The coating amount can be appropriately selected according to the purpose. Ordinarily, the coating amount is so set as to form a photocurable resin layer in a film thickness of 0.1 to 200 μm, preferably 1 to 150 μm. In order to enhance the film thickness uniformity on the substrate surface, a solvent may be applied onto the substrate prior to application of the photocurable resin composition (pre-wetting method). The type and amount of the solvent can be appropriately selected according to the purpose. Examples of the solvent include alcohols such as isopropyl alcohol (IPA), ketones such as cyclohexanone, and glycols such as propylene glycol monomethyl ether. The above-mentioned solvents which can be used as the solvent in the photocurable resin composition can also be used as the solvent to be applied onto the substrate.

In order to conduct the photocuring reaction efficiently, the solvent may be preliminarily evaporated off by pre-heating (pre-bake: PB), as required. The pre-heating can be carried out at 40 to 140° C. for a time of about one minute to about one hour.

Next, (ii) the exposure of the photocurable resin layer to light through a photomask is conducted. The exposure wavelength is generally 1 to 600 nm, preferably 10 to 600 nm, particularly preferably 190 to 500 nm. In this case, the photomask may be one in which a desired pattern is formed. Incidentally, the material of the photomask is not specifically restricted. Preferably, use is made of a material which screens (blocks) rays of the above-mentioned wavelength. For instance, chromium is suitably used, which is a non-limitative example. Examples of the rays having the above-mentioned wavelength include rays of various wavelength values generated by a radiation generating apparatus.

Specific examples of the applicable rays include ultraviolet rays such as g-line, h-line, i-line, etc., and far ultraviolet rays (248 nm, 193 nm), among which preferred are rays having a wavelength of 248 to 436 nm. The light exposure is preferably 10 to 10,000 mJ/cm$^2$.

Further, (iii) a heating treatment after exposure (PEB: post-exposure bake) is conducted for enhancing development sensitivity. The post-exposure bake is preferably carried out at 40 to 150° C. for 0.5 to 10 minutes. By such a heating treatment, the exposed portions of the photocurable resin layer undergoes crosslinking, resulting in the formation of an insolubilized pattern which is insoluble in the solvent set forth below as a developing liquid.

After the post-exposure bake, development is conducted using a developing liquid. Examples of the developing liquid include alcohols such as isopropyl alcohol (IPA), ketones such as cyclohexanone, and glycols such as propylene glycol monomethyl ether. Incidentally, the above-mentioned solvents which can be used as the solvent in the photocurable resin composition can also be used as the developing liquid.

The development may be carried out by an ordinary method including a method in which the substrate having a pattern formed thereon is immersed in the developing liquid. Thereafter, if necessary, cleaning (washing), rinsing, and drying are conducted to obtain a film of the cured resin composition having a desired pattern.

Meanwhile, in the case where pattern formation is not needed, for example, where it is desired to form a simple uniform film, it suffices to form a film in the same manner as the above-described pattern forming method, except that exposure to rays having an appropriate wavelength is conducted without intermediately using the photomask.

Furthermore, the photocurable resin composition according to the present invention can be used as an adhesive for substrates, in such a manner that a substrate formed thereon with a film of the composition is adhered to a second substrate so as to form an adhesive bond between the two substrates under suitable heat and pressure conditions. In such a situation, either one or both of the substrate formed thereon with the film and the second substrate may be turned into chips by dicing. The bonding is preferably carried out at a heating temperature of 50 to 200° C. for 1 to 60 minutes. Using a wafer bonder as a bonding apparatus, lamination (mutual adhesion or bonding) of wafers may be carried out at a reduced pressure while exerting a load. Alternatively, chip-wafer bonding or chip-chip bonding may be carried out using a flip chip bonder. The adhesive layer thus formed between the substrates is, when subjected to a post-cure treatment which will be described later, raised in bonding force to become a permanent bond.

The substrate carrying a pattern formed thereon or the substrates bonded together after pattern formation are subjected to post-cure at a temperature of 100 to 250° C., preferably 150 to 220° C., by use of an oven or a hot plate. Incidentally, when the post-cure temperature is 100 to 250° C., it is possible to enhance the crosslink density of the photocurable resin composition and to remove remaining volatile components, which is preferable from the viewpoint of adhesion to the substrate, heat resistance, strength, electrical characteristics and, further, bonding strength. When the laminated (mutually adhered or bonded) substrates are subjected to the post-cure treatment, the crosslink density of the resin film coat is increased, whereby the inter-substrate adhesive force can be enhanced. Incidentally, in the crosslinking reaction in the present invention, there takes place no side reaction that is attended by degassing; therefore, particularly when the photocurable resin composition is used as an adhesive for substrates, generation of lamination faults (voids) is not induced. The duration of the post-cure may be in the range from 10 minutes to 10 hours, particularly from 10 minutes to 3 hours.

The film thickness of the film coat obtained using the photocurable resin composition according to the present invention is normally 1 to 200 μm, preferably 5 to 50 μm.

Photocurable Dry Film

A photocurable dry film according to the present invention has a structure in which a photocurable resin layer obtained by applying the photocurable resin composition prepared by the above-mentioned method to a support film and drying the applied composition is sandwiched between the support film and a protective film.

In the present invention, the photocurable dry film is solid matter, and the photocurable resin layer does not contain solvent. Therefore, there is no possibility that bubbles formed due to volatilization of solvent might remain in the inside of the photocurable resin layer or at the boundary between the photocurable resin layer and the rugged substrate. When the flatness (planarization) and step coverage on a rugged substrate or the spacing between substrates stacked together is taken into consideration, there exists a suitable range for the film thickness of the photocurable resin layer. Accordingly, the film thickness of the photocurable resin layer is 5 to 200 μm, preferably 10 to 100 μm, from the viewpoint of flatness and step coverage or the spacing between substrates stacked on each other.

In addition, there is an intimate relation between the coefficient of viscosity and the fluidity (flowability) of the photocurable resin layer. The photocurable resin layer can exhibit appropriate fluidity within an appropriate viscosity coefficient range; in such a situation, the photocurable resin can enter deep into narrow gaps or the adhesion of the resin to the substrate can be enhanced due to softening of the resin. Accordingly, the coefficient of viscosity of the photocurable resin layer is 10 to 5,000 Pa·s, preferably 30 to 2,000 Pa·s, and particularly preferably 50 to 300 Pass at a temperature of 80 to 120° C. from the viewpoint of the fluidity (flowability) of the photocurable resin layer.

The photocurable dry film according to the present invention, when brought into close contact with a rugged substrate, the photocurable resin layer coats the substrate in the manner of following up to the ruggedness (minute projections and recesses), whereby a high flatness (planarization) can be achieved. Particularly where the main ingredient of the photocurable resin layer according to an embodiment of the present invention is a photocurable silicone composition, the low surface tension characteristic to the composition promises a further higher flatness. Furthermore, when the photocurable resin layer is brought into close contact with the substrate in a vacuum environment, generation of gaps between the resin layer and the substrate can be prevented more effectively.

Now, a method of producing the photocurable dry film in the present invention will be described below.

As an apparatus for producing the photocurable dry film, film coaters commonly used for manufacturing pressure sensitive adhesive products can be used. Examples of the film coaters include comma coater, comma reverse coater, multicoater, die coater, lip coater, lip reverse coater, direct gravure coater, offset gravure coater, three-roll bottom reverse coater, and four-roll bottom reverse coater.

The support film is paid off from a pay-off shaft of the film coater, and is passed through a coater head of the film coater, when the photocurable resin composition is applied to the support film in a predetermined thickness. Thereafter, the support film coated with the resin composition is passed through an oven with internal air circulation, at a predetermined temperature and over a predetermined time. The photocurable resin layer thus dried on the support film is passed, together with a protective film paid off from another pay-off shaft of the film coater, through lamination rolls at a predetermined pressure, whereby the protective film is laminated on the photocurable resin layer on the support film, and the laminated product is taken up onto a take-up shaft of the film coater. In this manner, the photocurable dry film is produced. In this case, the above-mentioned temperature is preferably 25 to 150° C., the above-mentioned time is preferably 1 to 100 minutes, and the above-mentioned pressure is preferably 0.01 to 5 MPa.

The support film used in producing the photocurable dry film according to the present invention may be a monolayer film alone or may be a multilayer film obtained by laminating a plurality of polymer films. Examples of the material of such film include films of synthetic resins such as polyethylene, polypropylene, polycarbonate, and polyethylene terephthalate, among which preferred is polyethylene terephthalate because of its appropriate flexibility, mechanical strength and heat resistance. In addition, these films may have been subjected to any of various treatments such as corona treatment, coating with a release agent, etc. As these films, commercial ones can be used, examples of which include CERAPEEL WZ(RX), CERAPEEL BX8(R) (both made by Toray Advanced Film Co., Ltd.), E7302 and E7304 (both made by Toyobo Co., Ltd.), PUREX G31 and PUREX G71T1 (made by Teijin DuPont Films Japan Limited), and PET38×1-A3, PET38×1-V8, AND PET38×1-X08 (made by Nippa Corporation).

On the other hand, as the protective film used in the photocurable dry film in the present invention, those films which are equivalent to or similar to the above-mentioned films for use as the support film can be used. Among such films, preferred are films of polyethylene terephthalate and polyethylene, which have appropriate flexibility. As these films, commercial ones can be used. Examples of the commercial polyethylene terephthalate films include the above-mentioned films, and examples of the commercial polyethylene films include GF-8 (made by Tamapoly Co., Ltd.) and PE FILM 0 TYPE (made by Nippa Corporation).

The thickness of each of the support film and the protective film as above-mentioned is preferably 10 to 100 μm, particularly preferably 25 to 50 μm, from the viewpoint of stability of production of the photocurable dry film and the tendency to be turned around the winding core, namely, so-called curling.

Pattern Forming Method

In pattern formation using the photocurable resin film, the protective film is peeled off from the photocurable dry film, and the photocurable resin layer is brought into close contact with a substrate by use of a film adhering (laminating) apparatus. Examples of the substrate used here include a silicon wafer, a TSV silicon wafer, a silicon wafer thinned by backside polishing, plastic or ceramic substrates, and substrates having a surface plated entirely or partly with a metal such as Ni, Au, etc. by an ion sputtering method or a plating method. A substrate provided with a groove(s) or a hole(s) having an aperture width of 10 to 100 μm and a depth of 10 to 120 μm may be used in some cases. As the film adhering (laminating) apparatus, a vacuum laminator is preferably used. The protective film is peeled from the photocurable dry film, the photocurable resin layer thus exposed is brought into close contact with the substrate on a table at a predetermined temperature in a vacuum chamber set to a predetermined degree of vacuum, by use of a laminating roll under a predetermined pressure. Incidentally, the above-mentioned temperature is preferably 60 to 120° C., the above-mentioned pressure is preferably 0 to 5.0 MPa, and the above-mentioned degree of vacuum is preferably 50 to 500 Pa.

In order to obtain a photocurable resin layer having a required thickness, the lamination (adhesion) of the film may be carried out a plurality of times, as required. The number of times of lamination (adhesion) may, for example, be 1 to 10, whereby it is possible to obtain a resin layer having a thickness of about 10 to 1,000 μm, particularly about 100 to 500 μm.

In order to perform the photocuring reaction of the photocurable resin layer efficiently and to enhance the adhesion of the photocurable resin layer to the substrate, pre-heating (pre-bake) may be carried out, as required. The pre-bake can be carried out, for example, at a temperature of 40 to 140° C. for a time of about one minute to one hour. The photocurable resin layer adhered to the substrate can be subjected to exposure, development and, if necessary, inter-substrate bonding, and post-cure heating treatment, in the same manner as the above-mentioned photocurable resin composition. Incidentally, the support film of the photocurable dry film is removed by peeling it off before the pre-bake or before PEB according to the process, or by other method.

The cured film coats obtained from the photocurable resin composition and the photocurable dry film as above-mentioned are excellent in heat resistance, flexibility, electrical insulating properties, mechanical characteristics, and adhesion to a substrate, and are used suitably as film coat for protection of electrical/electronic parts such as semiconductor devices.

EXAMPLES

Now, the present invention will be described in detail below by showing Synthetic Examples, Examples, and Comparative Example, but the invention is not limited to the following examples. Incidentally, in the following examples, the term "parts" means "parts by weight."

Synthesis of Epoxy Group-Containing Polymer Compound

First, compounds (M-1) to (M-5) used in Synthetic Examples in the present invention have the chemical structural formulas as follows.

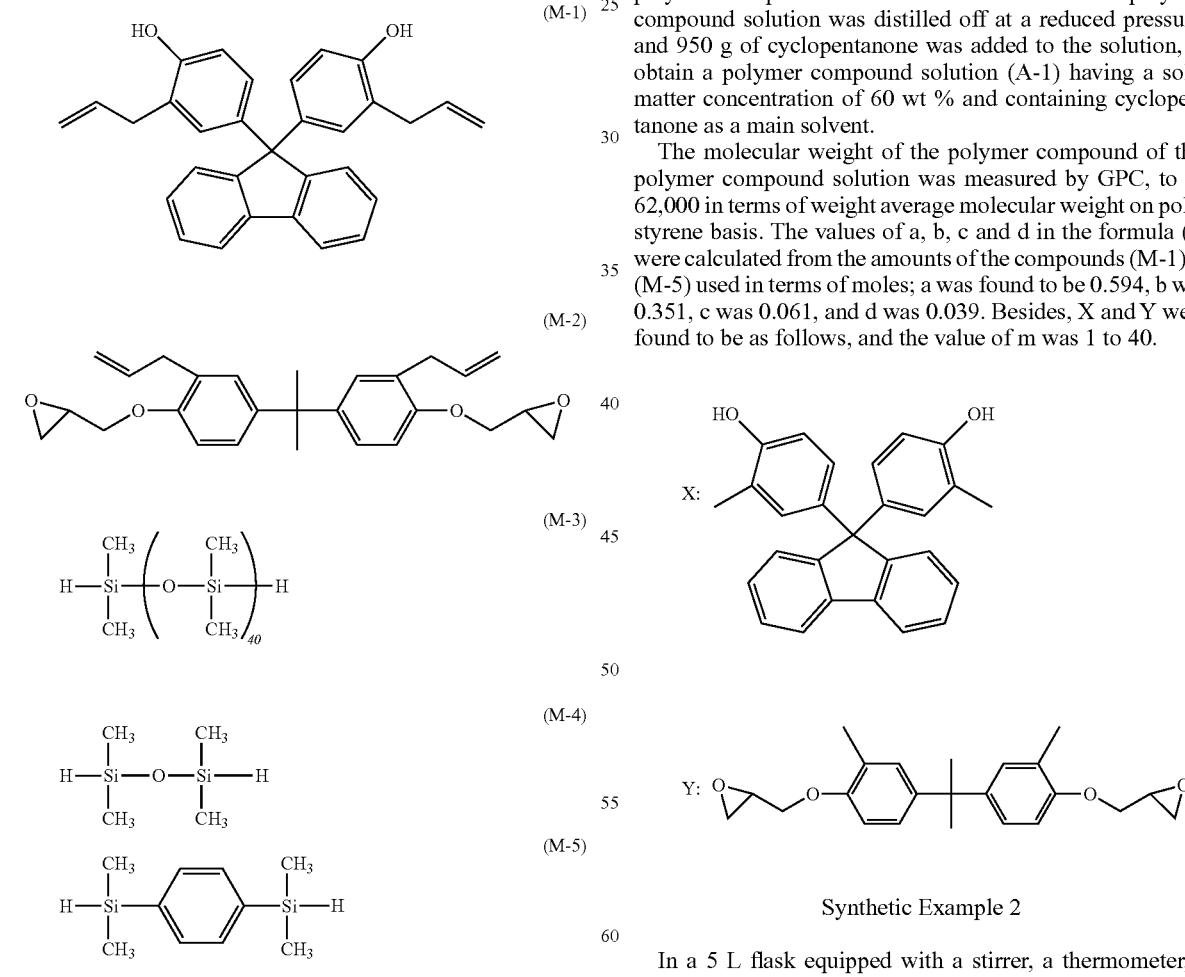

Synthetic Example 1

In a 5 L flask equipped with a stirrer, a thermometer, a nitrogen purger and a reflux condenser, 396.9 g of compound (M-1) and 45.0 g of compound (M-2) were dissolved in 1,875 g of toluene, then 949.6 g of compound (M-3) and 6.1 g of compound (M-4) were added to the solution, and the resulting mixture was warmed to 60° C. Thereafter, 2.2 g of carbon-supported platinum catalyst (5 wt %) was put into the flask. After the internal reaction temperature was confirmed to rise to 65 to 67° C., heating to 90° C. was conducted for three hours, and the reaction mixture was again cooled to 60° C. Then, 2.2 g of a carbon-supported platinum catalyst (5 wt %) was put into the flask, and 107.3 g of compound (M-5) was added dropwise into the flask over one hour. In this instance, the temperature inside the flask rose to 78° C. After the dropwise addition was over, the reaction mixture was further matured at 90° C. for three hours, followed by cooling to room temperature, and 1,700 g of methyl isobutyl ketone was added to the reaction mixture. The reaction mixture was then subjected to filtration under pressure by use of a filter, to remove the platinum catalyst. Further, 760 g of pure water was added to the polymer compound solution thus obtained, followed by stirring and by static liquid separation. Then, an aqueous layer as the lower layer was removed. This liquid-separating and rinsing operation was repeated six times, thereby removing trace amounts of acid components from the polymer compound solution. The solvent in the polymer compound solution was distilled off at a reduced pressure, and 950 g of cyclopentanone was added to the solution, to obtain a polymer compound solution (A-1) having a solid matter concentration of 60 wt % and containing cyclopentanone as a main solvent.

The molecular weight of the polymer compound of this polymer compound solution was measured by GPC, to be 62,000 in terms of weight average molecular weight on polystyrene basis. The values of a, b, c and d in the formula (1) were calculated from the amounts of the compounds (M-1) to (M-5) used in terms of moles; a was found to be 0.594, b was 0.351, c was 0.061, and d was 0.039. Besides, X and Y were found to be as follows, and the value of m was 1 to 40.

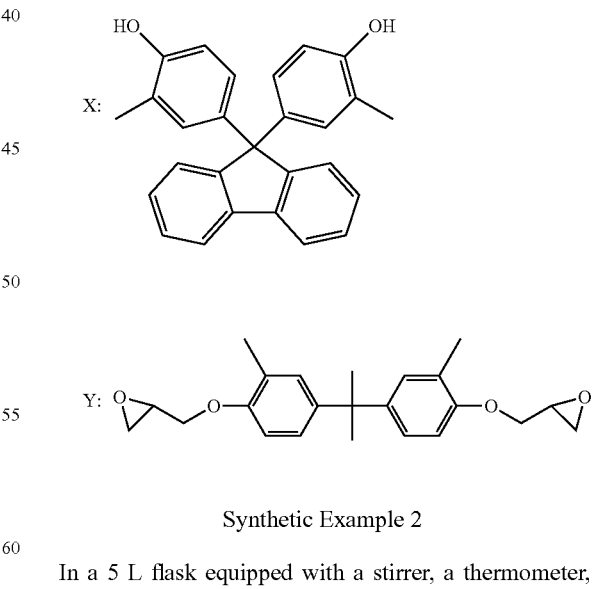

Synthetic Example 2

In a 5 L flask equipped with a stirrer, a thermometer, a nitrogen purger and a reflux condenser, 352.8 g of compound (M-1) and 90.0 g of compound (M-2) were dissolved in 1,875 g of toluene, then 949.6 g of compound (M-3) and 6.1 g of compound (M-4) were added to the solution, and the resulting mixture was warmed to 60° C. Thereafter, 2.2 g of a carbon-supported platinum catalyst (5 wt %) was put into the flask.

After the internal reaction temperature was confirmed to rise to 65 to 67° C., heating to 90° C. was conducted for three hours, and the reaction mixture was again cooled to 60° C. Then, 2.2 g of a carbon-supported platinum catalyst (5 wt %) was put into the flask, and 107.3 g of compound (M-5) was added dropwise into the flask over one hour. In this instance, the temperature inside the flask rose to 79° C. After the dropwise addition was over, the reaction mixture was further matured at 90° C. for three hours, followed by cooling to room temperature, and 1,700 g of methyl isobutyl ketone was added to the reaction mixture. The reaction mixture was then subjected to filtration under pressure by use of a filter, to remove the platinum catalyst. Further, 760 g of pure water was added to the polymer compound solution thus obtained, followed by stirring and by static liquid separation. Then, an aqueous layer as the lower layer was removed. This liquid-separating and rinsing operation was repeated six times, thereby removing trace amounts of acid components from the polymer compound solution. The solvent in the polymer compound solution was distilled off at a reduced pressure, and 980 g of cyclopentanone was added to the solution, to obtain a polymer compound solution (A-2) having a solid matter concentration of 60 wt % and containing cyclopentanone as a main solvent.

The molecular weight of the polymer compound of this polymer compound solution was measured by GPC, to be 64,000 in terms of weight average molecular weight on polystyrene basis. The values of a, b, c and d in the formula (1) were calculated from the amounts of the compounds (M-1) to (M-5) used in terms of moles; a was found to be 0.480, b was 0.320, c was 0.120, and d was 0.080. Besides, X, Y, and m were the same as those in Synthetic Example 1, respectively.

Synthetic Example 3

In a 5 L flask equipped with a stirrer, a thermometer, a nitrogen purger and a reflux condenser, 308.7 g of compound (M-1) and 135.0 g of compound (M-2) were dissolved in 1,875 g of toluene, then 949.6 g of compound (M-3) and 6.1 g of compound (M-4) were added to the solution, and the resulting mixture was warmed to 60° C. Thereafter, 2.2 g of a carbon-supported platinum catalyst (5 wt %) was put into the flask. After the internal reaction temperature was confirmed to rise to 65 to 67° C., heating to 90° C. was conducted for three 3 hours, and the reaction mixture was again cooled to 60° C. Then, 2.2 g of a carbon-supported platinum catalyst (5 wt %) was put into the flask, and 107.3 g of compound (M-5) was added dropwise into the flask over one hour. In this instance, the temperature inside the flask rose to 80° C. After the dropwise addition was over, the reaction mixture was further matured at 90° C. for three hours, followed by cooling to room temperature, and 1,700 g of methyl isobutyl ketone was added to the reaction mixture. The reaction mixture was then subjected to filtration under pressure by use of a filter, to remove the platinum catalyst. Further, 760 g of pure water was added to the polymer compound solution thus obtained, followed by stirring and by static liquid separation. Then, an aqueous layer as the lower layer was removed. This liquid-separating and rinsing operation was repeated six times, thereby removing trace amounts of acid components from the polymer compound solution. The solvent in the polymer compound solution was distilled off at a reduced pressure, and 900 g of cyclopentanone was added to the solution, to obtain a polymer compound solution (A-3) having a solid matter concentration of 60 wt % and containing cyclopentanone as a main solvent.

The molecular weight of the polymer compound of this polymer compound solution was measured by GPC, to be 68,000 in terms of weight average molecular weight on polystyrene basis. The values of a, b, c and d in the formula (1) were calculated from the amounts of the compounds (M-1) to (M-5) used in terms of moles; a was found to be 0.420, b was 0.280, c was 0.180, and d was 0.120. Besides, X, Y, and m were the same as those in Synthetic Example 1, respectively.

Synthetic Example 4

In a 5 L flask equipped with a stirrer, a thermometer, a nitrogen purger and a reflux condenser, 220.5 g of compound (M-1) and 225.0 g of compound (M-2) were dissolved in 1,875 g of toluene, then 949.6 g of compound (M-3) and 6.1 g of compound (M-4) were added to the solution, and the resulting mixture was warmed to 60° C. Thereafter, 2.2 g of a carbon-supported platinum catalyst (5 wt %) was put into the flask. After the internal reaction temperature was confirmed to rise to 65 to 67° C., heating to 90° C. was conducted for three hours, and the reaction mixture was again cooled to 60° C. Then, 2.2 g of a carbon-supported platinum catalyst (5 wt %) was put into the flask, and 107.3 g of compound (M-5) was added dropwise into the flask over one hour. In this instance, the temperature inside the flask rose to 80° C. After the dropwise addition was over, the reaction mixture was further matured at 90° C. for three hours, followed by cooling to room temperature, and 1,700 g of methyl isobutyl ketone was added to the reaction mixture. The reaction mixture was then subjected to filtration under pressure by use of a filter, to remove the platinum catalyst. Further, 760 g of pure water was added to the polymer compound solution thus obtained, followed by stirring and by static liquid separation. Then, an aqueous layer as the lower layer was removed. This liquid-separating and rinsing operation was repeated six times, thereby removing trace amounts of acid components from the polymer compound solution. The solvent in the polymer compound solution was distilled off at a reduced pressure, and 950 g of cyclopentanone was added to the solution, to obtain a polymer compound solution (A-4) having a solid matter concentration of 60 wt % and containing cyclopentanone as a main solvent.

The molecular weight of the polymer compound of this polymer compound solution was measured by GPC, to be 75,000 in terms of weight average molecular weight on polystyrene basis. The values of a, b, c and d in the formula (1) were calculated from the amounts of the compounds (M-1) to (M-5) used in terms of moles; a was found to be 0.294, b was 0.206, c was 0.306, and d was 0.194. Besides, X, Y, and m were the same as those in Synthetic Example 1, respectively.

Synthetic Example 5

In a 5 L flask equipped with a stirrer, a thermometer, a nitrogen purger and a reflux condenser, 441.0 g of compound (M-1) was dissolved in 1,875 g of toluene, then 949.6 g of compound (M-3) and 6.1 g of compound (M-4) were added to the solution, and the resulting mixture was warmed to 60° C. Thereafter, 2.2 g of a carbon-supported platinum catalyst (5 wt %) was put into the flask. After the internal reaction temperature was confirmed to rise to 65 to 67° C., heating to 90° C. was conducted for three hours, and the reaction mixture was again cooled to 60° C. Then, 2.2 g of a carbon-supported platinum catalyst (5 wt %) was put into the flask, and 107.3 g of compound (M-5) was added dropwise into the flask over one hour. In this instance, the temperature inside the flask rose to 78° C. After the dropwise addition was over, the reaction mixture was further matured at 90° C. for five hours, followed by cooling to room temperature, and 1,700 g of methyl isobutyl ketone was added to the reaction mixture. The reaction mixture was then subjected to filtration under pressure by use of a filter, to remove the platinum catalyst. Further, 760 g of pure water was added to the polymer compound solution thus obtained, followed by stirring and by static liquid separation. Then, an aqueous layer as the lower layer was removed. This liquid-separating and rinsing operation was repeated six times, thereby removing trace amounts of acid components from the polymer compound solution.

The solvent in the polymer compound solution was distilled off at a reduced pressure, and 950 g of cyclopentanone was added to the solution, to obtain a polymer compound solution (B-1) having a solid matter concentration of 60 wt % and containing cyclopentanone as a main solvent.

The molecular weight of the polymer compound of this polymer compound solution was measured by GPC, to be 51,000 in terms of weight average molecular weight on polystyrene basis. The values of a, b, c and d in the formula (1) were calculated from the amounts of the compounds (M-1) and (M-3) to (M-5) used in terms of moles; a was found to be 0.590, b was 0.410, c was 0, and d was 0.

Examples 1 to 8, Comparative Examples 1 to 5

Preparation of Photocurable Resin Composition

An epoxy group-containing polymer compound, a photoacid generator, a crosslinking agent and a solvent were blended respectively according to the formulations set forth in Table 1 below. Thereafter, stirring, mixing and dissolution were conducted at normal temperature, followed by microfiltration by use of 1.0 μm filter made of Teflon (registered trademark). In this manner, photocurable resin compositions of Examples 1 to 8 and Comparative Examples 1 to 5 were obtained respectively.

The photoacid generators set forth in Table 1 above are as follows.

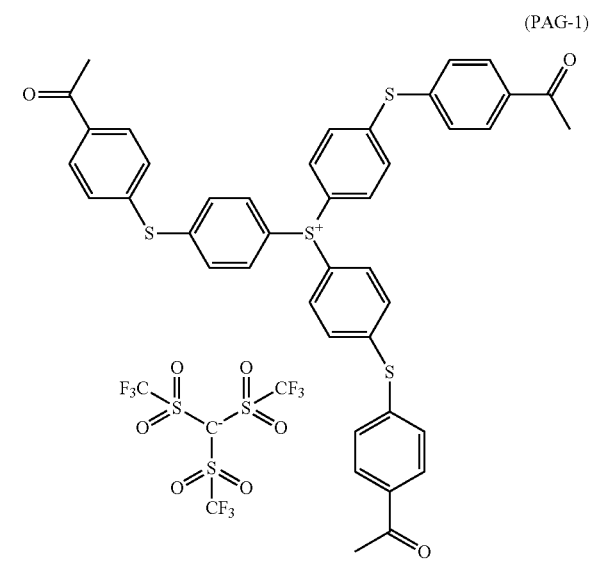 [SMILES: CC(=O)c1ccc(Sc2ccc([S+](c3ccc(Sc4ccc(C(C)=O)cc4)cc3)c3ccc(Sc4ccc(C(C)=O)cc4)cc3)cc2)cc1 ; O=S(=O)([C-](S(=O)(=O)C(F)(F)F)S(=O)(=O)C(F)(F)F)C(F)(F)F]
(PAG-1)

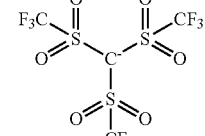

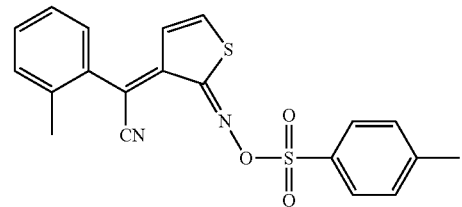
(PAG-2)

TABLE 1

| | Components blended in photocurable resin composition | | | |
|---|---|---|---|---|
| | Epoxy group-containing polymer compound (parts) | Photoacid generator (parts) | Crosslinking agent (parts) | Solvent (parts) |
| Example 1 | A-2 (100) | PAG-1 (3) | | cyclopentanone (60) |
| Example 2 | A-2 (100) | PAG-1 (1) | EP-1 (10) | cyclopentanone (65) |
| Example 3 | A-1 (100) | PAG-1 (2) | EP-1 (15) | cyclopentanone (65) |
| Example 4 | A-3 (100) | PAG-1 (1) | EP-1 (15) | cyclopentanone (65) |
| Example 5 | A-4 (100) | PAG-1 (2) | EP-1 (20) | cyclopentanone (65) |
| Example 6 | A-2 (100) | PAG-1 (2) | EP-2 (20) | cyclopentanone (65) |
| Example 7 | A-2 (100) | PAG-1 (2) | EP-3 (30) | cyclopentanone (65) |
| Example 8 | A-2 (100) | PAG-1 (10) | | cyclopentanone (65) |
| Comparative Example 1 | A-2 (100) | PAG-2 (2) | EP-1 (10) | cyclopentanone (65) |
| Comparative Example 2 | A-2 (100) | PAG-3 (2) | EP-1 (10) | cyclopentanone (65) |
| Comparative Example 3 | B-1 (100) | PAG-1 (2) | EP-1 (15) | cyclopentanone (65) |
| Comparative Example 4 | B-1 (100) | PAG-2 (2) | H-1 (15) | cyclopentanone (65) |
| Comparative Example 5 | A-2 (100) | PAG-1 (21) | | cyclopentanone (60) |

-continued (PAG-3)

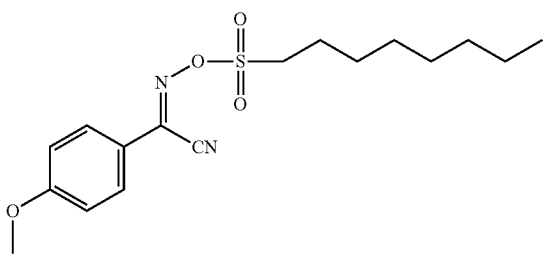

In addition, the crosslinking agents set forth in Table 1 above are as follows.

(EP-1)

(EP-2)

(n ≈ 3 to 5)

(EP-3)

As other crosslinking agent than the above, H-1: an alkylated melamine resin (made by Sanwa Chemical Co., Ltd.) was used.

Examples 9 to 16, Comparative Examples 6 to 10

Fabrication of Photocurable Dry Film

Using a die coater as a film coater and a polyethylene terephthalate film (38 μm in thickness) as a support film, each of the photocurable resin compositions of Examples 1 to 8 and Comparative Examples 1 to 5 was applied to the support film. Next, the thus coated support film was passed through an oven with internal air circulation (4 m in length) set to 100° C., over five minutes, to form a photocurable resin layer on the support film. The film thickness of the photocurable resin layer was set to 100 μm. Using a polyethylene film (50 μm in thickness) as a protective film, the protective film was laminated onto the support film from above the photocurable resin layer at a pressure of 1 MPa by use of lamination rolls, to fabricate a photocurable dry film.

Evaluation of Characteristics

Next, the photocurable resin compositions and the photocurable dry films obtained as above were evaluated in regard of various characteristics according to the following methods, the results being set forth in Tables 2 and 3 below.

<Resolution>

Using a spin coater, each of the photocurable resin compositions of Examples 1 to 8 and Comparative Examples 1 to 5 was applied to a non-treated 6-inch silicon wafer in a relevant film thickness as set forth in Table 2 below. In order to enhance in-plane uniformity of film thickness, cyclopentanone was dropped onto the wafer and spread over the whole wafer surface before the photocurable resin composition (resist) was dropped onto the wafer (pre-wetting method). In order to remove the solvent, pre-bake was conducted at 130° C. for three minutes by use of a hot plate, and a photocurable resin layer was thereby formed.

Next, through a quartz mask having regularly spaced lines and spaces with line widths of 10 to 200 μm, irradiation with light (exposure to light) was conducted at a light exposure (value at a wavelength of 365 nm) set forth in Table 2. Incidentally, for the exposure, a contact aligner type exposure system MA-8 (made by Suss Microtec K.K.) was used. After the irradiation with light, PEB was conducted at 130° C. for five minutes by use of a hot plate, followed by cooling. Thereafter, the coated substrate was subjected to paddle development by use of propylene glycol monomethyl ether acetate (PGMEA), 10 times for 50 seconds, and further to spray development by use of isopropyl alcohol (IPA) for one minute.

With respect to each of the photocurable dry films of Examples 9 to 16 and Comparative Examples 6 to 10, the protective film was peeled off, and the photocurable resin layer on the support film was brought into close contact with the above-mentioned substrate by use of a vacuum laminator TEAM-100RF (made by Takatori Corporation) while setting the degree of vacuum in a vacuum chamber to 80 Pa. The temperature was 110° C. After the pressure inside the vacuum chamber was returned to normal pressure, the substrate was taken out of the vacuum laminator, and the support film was peeled off. Subsequently, in order to enhance adhesion to the substrate, pre-bake was conducted at 130° C. for five minutes by use of a hot plate. The photocurable resin layer thus obtained was put to exposure by use of the contact aligner type exposure in the same manner as above-mentioned. After irradiation with light, PEB was conducted at 130° C. for five minutes by use of a hot plate, followed by cooling. Then, the substrate was put to paddle development by use of PGMEA, 10 times for 50 seconds, and subsequently put further to spray development by use of IPA for one minutes.

The photocurable resin layer on the wafer, after the pattern formation by the above-mentioned method, was subjected to post-cure at 180° C. for two hours by use of an oven, while purging with nitrogen. Thereafter, film thickness after development, resolution of 200-μm line-and-space pattern, light exposure at which the line widths and the space widths become equal intervals, and pattern side wall angle at that light exposure, were measured by observation under a scanning electron microscope (SEM).

<Embedding Properties>

In each of the photocurable dry films of Examples 9 to 16 and Comparative Examples 6 to 10, the protective film was removed and the photocurable resin layer on the support film was allowed to adhere to a substrate (wafer) provided with a hole having an aperture width of 10 to 100 µm and a depth of 10 to 120 µm by using a vacuum laminator (TEAM-100RF manufactured by Taketori Co., Ltd.) with a degree of vacuum of 80 Pa in a vacuum chamber at 110° C. After putting the pressure to normal pressure, the substrate was taken from the vacuum laminator and then the support film was removed from the photocurable resin layer. Irradiation with light was conducted to the photocurable resin layer on the substrate, followed by conducting PEB (post-exposure bake) to the resin layer at 130° C. for 5 minutes on a hot plate and then cooling it. The resin layer was further subjected to post curing at 180° C. for 2 hours by using an oven, while conducting nitrogen gas purge. The process of from the irradiation with light to the post curing ensured easiness of a cross-sectional view observation of the wafer.

Then, the embedding state of the dry film to the hole was evaluated about the fault of the embedding by a light microscope or SEM observation.

<Electrical Characteristic (Dielectric Breakdown Strength)>

In order to evaluate dielectric breakdown strength of a cured film coat formed from the photocurable resin composition or the photocurable dry film, each of the photocurable resin composition of Examples 1 to 8 and Comparative Examples 1 to 5 was applied by a bar coater to an iron plate measuring 13 cm×15 cm and 0.7 mm in thickness, followed by heating in an oven at 180° C. for two hours, to obtain a cured film coat. The photocurable resin composition was applied in such a manner that the film thickness thereof after curing would be 0.2 µm.

As for the photocurable dry films of Examples 9 to 16 and Comparative Examples 6 to 10, each of the dry films was laminated onto the above-mentioned iron plate a plurality of times at normal pressure, followed by heating in an oven at 180° C. for two hours, to obtain a cured film coat having a thickness of 0.2 µm. By utilizing the cured film coat, dielectric breakdown strength of the cured coat film of each of the photocurable resin compositions was measured on a dielectric breakdown testing machine TM-5031AM (made by Tamadensoku Co., Ltd.).

<Adhesion Properties>

In order to evaluate bonding performance for adhesion between substrates, with respect to the cured film coats formed from the photocurable resin compositions and the photocurable dry films, each of the photocurable resin compositions of Examples 1 to 8 and Comparative Examples 1 to 5 and the photocurable dry films of Examples 9 to 16 and Comparative Examples 6 to 10 was applied to a non-treated 8-inch silicon wafer by a spin coater or was laminated onto the silicon wafer by a vacuum laminator. The film thickness was as set forth in Table 2 below. Pre-bake was conducted, and a photocurable resin layer was thereby formed.

Next, exposure was conducted by the contact aligner type exposure system MA-8 (made by Suss Microtec K.K.), without intermediately using the quartz mask. After irradiation with light, the silicon wafer was put to PEB at 130° C. for five minutes by use of a hot plate. The thus treated silicon wafer was laminated onto a non-treated 8-inch quartz glass or Tempax glass, and provisional bonding heating was conducted at 160° C. for five minutes by use of a hot plate. Thereafter, post-cure was conducted at 180° C. for two hours in an oven, to form an inter-substrate adhesive layer.

The wafer, after the bonding (adhesion), was again heated at 220° C. for three hours in an oven while purging with nitrogen. Thereafter, the presence/absence of lamination faults induced was checked.

<Measurement of Warp of Wafer>

In order to evaluate flexibility of the cured film coats formed from the photocurable resin compositions or the photocurable dry films, each of the photocurable resin compositions of Examples 1 to 8 and Comparative Examples 1 to 5 and the photocurable dry films of Examples 9 to 16 and Comparative Examples 6 to 10 was applied to a non-treated 8-inch silicon wafer by a spin coater or was laminated onto the silicon wafer by a vacuum laminator. The film thickness was as set forth in Table 2 below. Pre-bake was conducted, and a photocurable resin layer was thereby formed.

Next, exposure was conducted by use of the contact aligner type exposure system MA-8 (made by Suss Microtec K.K.), without intermediately using the quartz mask. After irradiation with light, PEB was conducted at 130° C. for five minutes by use of a hot plate. Further, the photocurable resin layer on the wafer obtained by the above-mentioned method was subjected to post-cure in an oven at 180° C. for two hours, while purging with nitrogen.

Warp of the wafer, before formation of the photocurable resin layer and after the post-cure, was measured by FLX-2320-S (made by Toho Technology Corporation), and change in warp was thereby calculated.

TABLE 2

| | Photocurable Resin Composition | | | | | |
|---|---|---|---|---|---|---|
| | Film thickness after development (µm) | 200 µm pattern resolution, light exposure (mJ/cm²) | 200 µm line pattern side wall angle | Electrical characteristic, dielectric breakdown strength (V/µm) | Adhesion properties, fault induced | Change in warp (µm) |
| Example 1 | 101 | 1,500 | 91 | 500 | Absent | 15 |
| Example 2 | 105 | 1,800 | 92 | 485 | Absent | 13 |
| Example 3 | 98 | 2,400 | 91 | 490 | Absent | 20 |
| Example 4 | 107 | 2,800 | 93 | 450 | Absent | 25 |
| Example 5 | 95 | 3,000 | 93 | 470 | Absent | 30 |
| Example 6 | 110 | 2,200 | 92 | 460 | Absent | 20 |
| Example 7 | 102 | 2,600 | 92 | 475 | Absent | 20 |
| Example 8 | 104 | 8,000 | 95 | 500 | Absent | 20 |
| Comparative Example 1 | 96 | Pattern formation was impossible | — | 300 | Absent | 25 |
| Comparative Example 2 | 112 | Pattern formation was impossible | — | 300 | Absent | 35 |

TABLE 2-continued

| | Photocurable Resin Composition | | | | | |
|---|---|---|---|---|---|---|
| | Film thickness after development (μm) | 200 μm pattern resolution, light exposure (mJ/cm²) | 200 μm line pattern side wall angle | Electrical characteristic, dielectric breakdown strength (V/μm) | Adhesion properties, fault induced | Change in warp (μm) |
| Comparative Example 3 | 106 | Pattern formation was impossible | — | 310 | Absent | 35 |
| Comparative Example 4 | 106 | 8,000 | 98 | 410 | Present | 30 |
| Comparative Example 5 | 104 | Pattern formation was impossible | — | 500 | Absent | 18 |

TABLE 3

| | Photocurable Dry Film | | | | | | |
|---|---|---|---|---|---|---|---|
| | Film thickness (μm) | Fault of embedding | 200 μm pattern resolution, light exposure (mJ/cm²) | 200 μm line pattern side wall angle | Electrical characteristic, dielectric breakdown strength (V/μm) | Adhesion properties, fault induced | Change in warp (μm) |
| Example 9 | 100 | Absent | 2,500 | 92 | 520 | Absent | 10 |
| Example 10 | 102 | Absent | 2,800 | 91 | 500 | Absent | 10 |
| Example 11 | 101 | Absent | 3,200 | 93 | 510 | Absent | 18 |
| Example 12 | 98 | Absent | 3,500 | 92 | 470 | Absent | 23 |
| Example 13 | 97 | Absent | 3,800 | 93 | 490 | Absent | 25 |
| Example 14 | 100 | Absent | 3,000 | 92 | 480 | Absent | 17 |
| Example 15 | 99 | Absent | 3,200 | 91 | 515 | Absent | 15 |
| Example 16 | 99 | Absent | 6,000 | 95 | 515 | Absent | 20 |
| Comparative Example 6 | 105 | Absent | Pattern formation was impossible | — | 350 | Absent | 23 |
| Comparative Example 7 | 100 | Absent | Pattern formation was impossible | — | 350 | Absent | 32 |
| Comparative Example 8 | 101 | Present | Pattern formation was impossible | — | 360 | Absent | 30 |
| Comparative Example 9 | 100 | Present | 10,000 | 98 | 440 | Present | 25 |
| Comparative Example 10 | 100 | Absent | Pattern formation was impossible | — | 520 | Absent | 10 |

Example 17

Example 3 was repeated except that 0.02 part of triethanolamine was added to the photocurable resin composition of Example 3.

The resulting photocurable resin composition of Example 17 was evaluated in the same procedure as in Example 3.

In the results, the film thickness after development was 100 μm, the 200 μm pattern resolution was 6,000 mJ/cm², and the 200 μm line pattern side wall angle was 90°. There is no problem on the electrical characteristic, adhesion properties and change in warp.

Japanese Patent Application No. 2010-230427 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photocurable resin composition comprising:

(A) 100 parts by weight of an epoxy group-containing polymer compound having repeating units represented by the following general formula (1) and having a weight average molecular weight of 3,000 to 500,000,

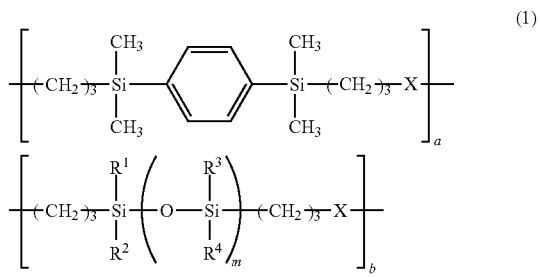

-continued

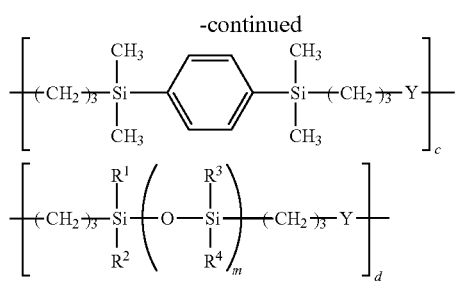

where $R^1$ to $R^4$, which may be identical or different, are each a monovalent hydrocarbon group of 1 to 8 carbon atoms, m is an integer of 1 to 100, a, b, c and d each indicate the proportion of each of the repeating units based on the total number of the repeating units, and are each 0 or a positive number, such that c and d are not simultaneously 0 and that $0 < (c+d)/(a+b+c+d) \leq 1.0$, and X and Y are each a divalent organic group represented by the following general formula (2) or (3), provided that the polymer compound has at least one divalent organic group represented by the formula (3),

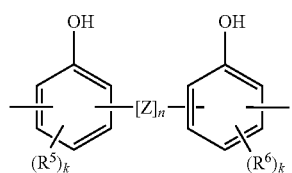
(2)

where Z is a divalent organic group selected from among

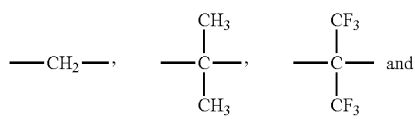

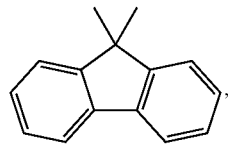

n is 0 or 1, $R^5$ and $R^6$, which may be identical or different, are each an alkyl or alkoxy group of 1 to 4 carbon atoms, and k is any of 0, 1 and 2,

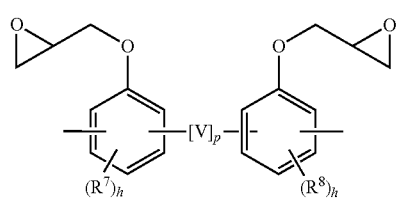
(3)

where V is a divalent organic group selected from among

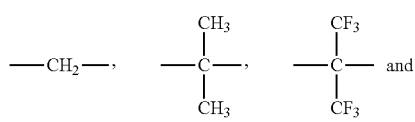

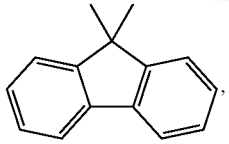

p is 0 or 1, $R^7$ and $R^8$, which may be identical or different, are each an alkyl or alkoxy group of 1 to 4 carbon atoms, and h is any of 0, 1 and 2;

(B) 0.05 to 20 parts by weight, based on 100 parts by weight of component (A), of a photoacid generator represented by the following formula (8),

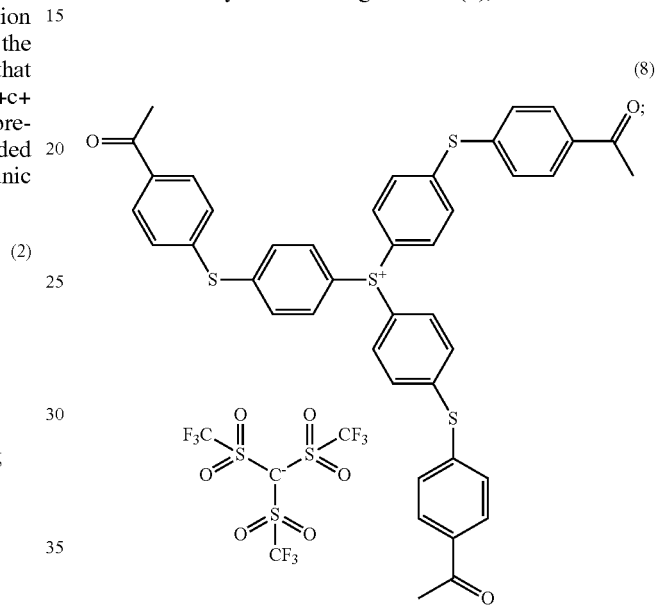
(8)

and (C) a solvent.

2. The photocurable resin composition according to claim 1, wherein in the general formula (1) of component (A), X is a divalent organic group represented by the general formula (2), and Y is a divalent organic group represented by the general formula (3).

3. The photocurable resin composition according to claim 1, wherein in the general formula (1), $0.05 \leq c/(a+b+c+d) \leq 0.5$.

4. The photocurable resin composition according to claim 1, wherein in the general formula (1), $0.05 \leq d/(a+b+c+d) \leq 0.5$.

5. The photocurable resin composition according to claim 1, further comprising (D) a crosslinking agent.

6. The photocurable resin composition according to claim 5, wherein the crosslinking agent of component (D) is an epoxy compound having two or more epoxy groups on average in one molecule thereof.

7. The photocurable resin composition according to claim 1, further comprising (E) a basic compound.

8. A photocurable dry film obtained by applying the photocurable resin composition according to claim 1 to a support film, followed by drying.

9. A laminate wherein cured product layers of the photocurable resin composition according to claim 1 or the photocurable dry film according to claim 8 are laminated on a substrate provided with a groove and/or a hole having an aperture width of 10 to 100 mm and a depth of 10 to 120 mm.

10. A pattern forming method comprising the steps of:
(i) applying the photocurable resin composition according to claim 1 to a substrate and then optionally heating the photocurable resin composition, or bringing the photocurable dry film according to claim 8 into close contact with a substrate and then optionally heating the photocurable dry film, so as to form a photocurable resin layer on the substrate;
(ii) exposing the photocurable resin layer to light through a photomask; and
(iii) heat treating the resin layer after exposure and then developing it with a developing liquid so as to dissolve away a non-exposed portion of the resin layer.

11. The pattering forming method according to claim 10, further comprising the step of (iv) post-curing the resin layer having a pattern formed by the development at a temperature of 100 to 250° C.

12. The pattern forming method according to claim 10, wherein the substrate is provided with a groove and/or a hole having an aperture width of 10 to 100 mm and a depth of 10 to 120 mm.

13. A film for protecting an electrical/electronic part comprising a cured film obtained by the pattern forming method according to claim 10.

14. A film for bonding a substrate comprising a cured film obtained by the pattern forming method according to claim 10.

15. The photocurable resin composition according to claim 1, wherein the solvent (C) is present in an amount of 50 to 1,000 parts by weight based on 100 parts by weight of the total weight of the epoxy group-containing polymer (A) and the photoacid generator (B).

* * * * *